（12）United States Patent
Lin et al.

(10) Patent No.: US 10,075,194 B2
(45) Date of Patent: Sep. 11, 2018

(54) TAIL BITING CONVOLUTIONAL CODE (TBCC) ENHANCEMENT WITH STATE PROPAGATION AND LIST DECODING

(71) Applicant: QUALCOMM Incorporated, San Diego, CA (US)

(72) Inventors: Jamie Menjay Lin, San Diego, CA (US); Yang Yang, San Diego, CA (US); Joseph Binamira Soriaga, San Diego, CA (US); Jing Jiang, San Diego, CA (US); Tingfang Ji, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/358,960

(22) Filed: Nov. 22, 2016

(65) Prior Publication Data

US 2017/0331585 A1    Nov. 16, 2017

Related U.S. Application Data

(60) Provisional application No. 62/336,429, filed on May 13, 2016.

(51) Int. Cl.
| H03M 13/41 | (2006.01) |
| H04B 7/0413 | (2017.01) |
| H04L 1/00 | (2006.01) |

(52) U.S. Cl.
CPC ..... *H03M 13/4115* (2013.01); *H03M 13/413* (2013.01); *H03M 13/4169* (2013.01); *H04B 7/0413* (2013.01); *H04L 1/0054* (2013.01)

(58) Field of Classification Search
CPC ............... H03M 13/413; H03M 13/41; H03M 13/2996; H03M 13/4115; H03M 13/4169; H03M 13/3938; H04L 1/0054
See application file for complete search history.

(56) References Cited

U.S. PATENT DOCUMENTS

| 6,161,210 A | 12/2000 | Chen et al. |
| 6,452,984 B1 * | 9/2002 | Banister ................ H03M 13/39 375/262 |

(Continued)

OTHER PUBLICATIONS

International Search Report and Written Opinion—PCT/US2017/023875—ISA/EPO—dated Jul. 7, 2017.

(Continued)

*Primary Examiner* — Sophia Vlahos
(74) *Attorney, Agent, or Firm* — Qualcomm IP Dept.; James Hunt Yancey, Jr.

(57) ABSTRACT

Certain aspects of the present disclosure relate to techniques and apparatus for enhanced decoding, for example, by providing a multi-phase tail biting convolutional code (TBCC) decoding algorithm. An exemplary method generally includes obtaining, via a wireless medium, a codeword encoded with a TBCC encoding scheme, generating metrics for candidate paths through trellis stages of a decoder, propagating information from at least one of the trellis stages to a later trellis stage, while generating the metrics, selecting a set of the candidate paths based on the propagated information, and decoding the encoded codeword by evaluating the selected set of candidate paths based, at least in part, on the generated metrics. Other aspects, embodiments, and features are claimed and described.

20 Claims, 10 Drawing Sheets

(56) References Cited

U.S. PATENT DOCUMENTS

| | | | |
|---|---|---|---|
| 6,934,343 B2* | 8/2005 | Hocevar | H03M 13/3961 375/262 |
| 2009/0041166 A1* | 2/2009 | Patel | H03M 13/3746 375/341 |
| 2012/0036416 A1 | 2/2012 | Wang et al. | |
| 2012/0151304 A1* | 6/2012 | Wu | H03M 13/413 714/786 |
| 2013/0111305 A1* | 5/2013 | Wang | H03M 13/23 714/786 |
| 2013/0114766 A1* | 5/2013 | Mueller-Weinfurtner | H03M 13/3994 375/341 |
| 2013/0121168 A1* | 5/2013 | Luo | H04W 72/042 370/242 |
| 2015/0236717 A1* | 8/2015 | El-Khamy | H03M 13/3905 714/807 |
| 2016/0036465 A1* | 2/2016 | Kuo | H03M 13/3938 714/792 |
| 2016/0336465 A1* | 11/2016 | Moslehi | H01L 31/035281 |

OTHER PUBLICATIONS

Jorge O., et al., "An Efficiently Implementable Maximum Likelihood Decoding Algorithm for Tailbiting Codes", Annales DES Telecommunications—Annals of Telecommunications, Get Lavoisier, Paris, FR, vol. 69, No. 9, Oct. 19, 2013 (Oct. 19, 2013), XP035396341, pp. 529-537.

Mohammad M., et al., "Comparing List Viterbi Algorithms with and without Tail Bits", Proc. 2008 Military Communications Conference (MILCOM), IEEE, Piscataway, NJ, USA, Nov. 16, 2008 (Nov. 16, 2008), XP031408097, pp. 1-6.

\* cited by examiner

Convolutional Code (CC)

Information bit stream: 1 1 0 0 1 0 1 0
Encoding process: [0 0 0 1] 1 0 0 1 0 1 0 0 0 0 → coded bit 1,2,3
0 [0 0 1 1] 0 0 1 0 1 0 0 0 0 → coded bit 4,5,5
0 0 [0 1 1 0] 0 1 0 1 0 0 0 0 → coded bit 7,8,9
0 0 0 [1 1 0 0] 1 0 1 0 0 0 0 → coded bit 10,11,12

0 0 0 1 1 0 0 1 0 1 [0 0 0 0] → coded bit 31,32,33

Viterbi Algorithm For TBCC (cont')

1. Start with equal weight for each state in the first iteration
2. At the end of the trellis construction, identify a number of best states
3. Take the back trace output over a certain range of stages for the decoded bits SW Phase             PD Phase

TAIL BITING CONVOLUTIONAL CODE (TBCC) ENHANCEMENT WITH STATE PROPAGATION AND LIST DECODING

CLAIM OF PRIORITY UNDER 35 U.S.C. § 119

This application claims priority to and benefit of U.S. Provisional Patent Application Ser. No. 62/336,429, filed May 13, 2016, which is herein incorporated by reference in its entirety as if fully set forth below and for all applicable purposes.

TECHNICAL FIELD

Certain aspects of the present disclosure generally relate to wireless communications and, more particularly, to a method and apparatus for improving decoding performance. Embodiments serve to enable and provide decoding techniques yielding power efficiency and communication system efficiency gains.

INTRODUCTION

In a transmitter of all modern wireless communication links, an output sequence of bits from an error correcting code can be mapped onto a sequence of complex modulation symbols. These symbols can be then used to create a waveform suitable for transmission across a wireless channel. Particularly as data rates increase, decoding performance on the receiver side can be a limiting factor to achievable data rates.

BRIEF SUMMARY

The following summarizes some aspects of the present disclosure to provide a basic understanding of the discussed technology. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in summary form as a prelude to the more detailed description that is presented later.

Certain aspects of the present disclosure provide techniques and apparatus for improving decoding performance of a decoder. Some embodiments include a tail-biting convolutional code (TBCC) decoder. These techniques can be incorporated in one or more communication devices, methods, and/or systems.

Certain aspects provide a method for wireless communications. The method generally includes obtaining, via a wireless medium, a codeword encoded with a tail biting convolutional code (TBCC) encoding scheme, generating metrics for candidate paths through trellis stages of a decoder, propagating information from at least one of the trellis stages to a later trellis stage, while generating the metrics, selecting a set of the candidate paths based on the propagated information, and decoding the encoded codeword by evaluating the selected set of candidate paths based, at least in part, on the generated metrics.

Certain aspects provide an apparatus for wireless communications. The apparatus generally includes at least one processor configured to obtain, via a wireless medium, a codeword encoded with a tail biting convolutional code (TBCC) encoding scheme, generate metrics for candidate paths through trellis stages of a decoder, propagate information from at least one of the trellis stages to a later trellis stage, while generating the metrics, select a set of the candidate paths based on the propagated information, and decode the encoded codeword by evaluating the selected set of candidate paths based, at least in part, on the generated metrics.

Certain aspects provide an apparatus for wireless communications. The apparatus generally includes means for obtaining, via a wireless medium, a codeword encoded with a tail biting convolutional code (TBCC) encoding scheme, means for generating metrics for candidate paths through trellis stages of a decoder, means for propagating information from at least one of the trellis stages to a later trellis stage, while generating the metrics, means for selecting a set of the candidate paths based on the propagated information, and means for decoding the encoded codeword by evaluating the selected set of candidate paths based, at least in part, on the generated metrics.

Certain aspects provide a non-transitory computer-readable medium for wireless communications. The non-transitory computer-readable medium generally includes instructions for obtaining, via a wireless medium, a codeword encoded with a tail biting convolutional code (TBCC) encoding scheme, generating metrics for candidate paths through trellis stages of a decoder, propagating information from at least one of the trellis stages to a later trellis stage, while generating the metrics, selecting a set of the candidate paths based on the propagated information, and decoding the encoded codeword by evaluating the selected set of candidate paths based, at least in part, on the generated metrics.

The techniques described herein may be embodied in methods, apparatuses, and computer program products. This includes an array of wireless communication components/devices such as network-side and/or user-side devices. Using the technology described herein enables and provides reduced decoding efforts capable of yielding faster and efficient wireless communication arrangements.

Other aspects, features, and embodiments of the present invention will become apparent to those of ordinary skill in the art, upon reviewing the following description of specific, exemplary embodiments of the present invention in conjunction with the accompanying figures. While features of the present invention may be discussed relative to certain embodiments and figures below, all embodiments of the present invention can include one or more of the advantageous features discussed herein. In other words, while one or more embodiments may be discussed as having certain advantageous features, one or more of such features may also be used in accordance with the various embodiments of the invention discussed herein. In similar fashion, while exemplary embodiments may be discussed below as device, system, or method embodiments it should be understood that such exemplary embodiments can be implemented in various devices, systems, and methods.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Figure 1:
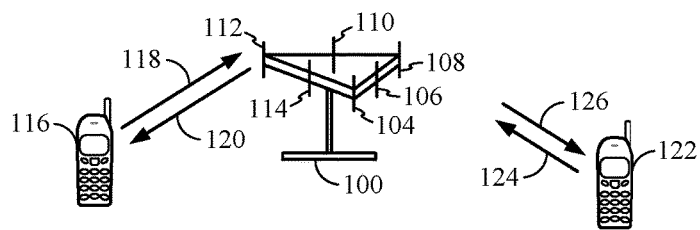
FIG. 1 illustrates an example wireless communication system in accordance with certain aspects of the present disclosure.

A tail biting convolutional code (TBCC) list decoder generally refers to a TBCC decoder in which a "list" of candidate decoding paths is maintained and evaluated. A best candidate from the list is ultimately chosen as the decoded codeword-provided certain criteria are met (e.g., that a CRC check for the decoded codeword passes). Aspects of the present disclosure provide techniques for improving the decoding efficiency of a TBCC list decoder.

For example, in some cases, to improve decoding efficiency of the TBCC decoder it may be beneficial to propagate state information through trellis stages of the decoder. For example, propagating original (beginning) state information (e.g., at a beginning stage) to later stage in the decoder would allow candidate decoding paths (that do not end at the same state) to be disqualified, thus reducing the number of candidate paths that would need to be evaluated and reducing the amount of time needed to decode a codeword.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different wireless technologies, system configurations, networks, and transmission protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

An Example Wireless Communication System

The techniques described herein may be used for various wireless communication networks such as Orthogonal Frequency Division Multiplexing (OFDM) networks, Time Division Multiple Access (TDMA) networks, Frequency Division Multiple Access (FDMA) networks, Orthogonal FDMA (OFDMA) networks, Single-Carrier FDMA (SC-FDMA) networks, Code Division Multiple Access (CDMA) networks, etc. The terms "networks" and "systems" are often used interchangeably. A CDMA network may implement a radio technology such as Universal Terrestrial Radio Access (UTRA), CDMA2000, etc. UTRA includes Wideband-CDMA (W-CDMA) and Low Chip Rate (LCR). CDMA2000 covers IS-2000, IS-95 and IS-856 standards. A TDMA network may implement a radio technology such as Global System for Mobile Communications (GSM). An OFDMA network may implement a radio technology such as Evolved UTRA (E-UTRA), IEEE 802.11, IEEE 802.16 (e.g., WiMAX (Worldwide Interoperability for Microwave Access)), IEEE 802.20, Flash-OFDM®, etc. UTRA, E-UTRA, and GSM are part of Universal Mobile Telecommunication System (UMTS). Long Term Evolution (LTE) and Long Term Evolution Advanced (LTE-A) are upcoming releases of UMTS that use E-UTRA. UTRA, E-UTRA, GSM, UMTS and LTE are described in documents from an organization named "3rd Generation Partnership Project" (3GPP). CDMA2000 is described in documents from an organization named "3rd Generation Partnership Project 2" (3GPP2). CDMA2000 is described in documents from an organization named "3rd Generation Partnership Project 2" (3GPP2). These various radio technologies and standards are known in the art. For clarity, certain aspects of the techniques are described below for LTE and LTE-A.

The teachings herein may be incorporated into (e.g., implemented within or performed by) a variety of wired or wireless apparatuses (e.g., nodes). In some aspects a node comprises a wireless node. Such wireless node may provide, for example, connectivity for or to a network (e.g., a wide area network such as the Internet or a cellular network) via a wired or wireless communication link. In some aspects, a wireless node implemented in accordance with the teachings herein may comprise an access point or an access terminal.

An access point ("AP") may comprise, be implemented as, or known as NodeB, Radio Network Controller ("RNC"), eNodeB, Base Station Controller ("BSC"), Base Transceiver Station ("BTS"), Base Station ("BS"), Transceiver Function ("TF"), Radio Router, Radio Transceiver, Basic Service Set ("BSS"), Extended Service Set ("ESS"), Radio Base Station ("RBS"), or some other terminology. In some implementations an access point may comprise a set top box kiosk, a media center, or any other suitable device that is configured to communicate via a wireless or wired medium.

An access terminal ("AT") may comprise, be implemented as, or known as an access terminal, a subscriber station, a subscriber unit, a mobile station, a remote station, a remote terminal, a user terminal, a user agent, a user device, user equipment, a user station, or some other terminology. In some implementations an access terminal may comprise a cellular telephone, a cordless telephone, a Session Initiation Protocol ("SIP") phone, a wireless local loop ("WLL") station, a personal digital assistant ("PDA"), a handheld device having wireless connection capability, a Station ("STA"), or some other suitable processing device connected to a wireless modem. Accordingly, one or more aspects taught herein may be incorporated into a phone (e.g., a cellular phone or smart phone), a computer (e.g., a laptop), a portable communication device, a portable computing device (e.g., a personal data assistant), a tablet, an entertainment device (e.g., a music or video device, or a satellite radio), a television display, a flip-cam, a security video camera, a digital video recorder (DVR), a global positioning system device, or any other suitable device that is configured to communicate via a wireless or wired medium.

Referring to FIG. 1, a multiple access wireless communication system according to one aspect is illustrated. In an aspect of the present disclosure, the wireless communication system from FIG. 1 may be a wireless mobile broadband system based on Orthogonal Frequency Division Multiplexing (OFDM). An access point 100 (AP) may include multiple antenna groups, one group including antennas 104 and 106, another group including antennas 108 and 110, and an additional group including antennas 112 and 114. In FIG. 1, only two antennas are shown for each antenna group, however, more or fewer antennas may be utilized for each antenna group. Access terminal 116 (AT) may be in communication with antennas 112 and 114, where antennas 112 and 114 transmit information to access terminal 116 over forward link 120 and receive information from access terminal 116 over reverse link 118. Access terminal 122 may be in communication with antennas 106 and 108, where antennas 106 and 108 transmit information to access terminal 122 over forward link 126 and receive information from access terminal 122 over reverse link 124. In a FDD system, communication links 118, 120, 124 and 126 may use different frequency for communication. For example, forward link 120 may use a different frequency then that used by reverse link 118.

Each group of antennas and/or the area in which they are designed to communicate is often referred to as a sector of the access point. In one aspect of the present disclosure each antenna group may be designed to communicate to access terminals in a sector of the areas covered by access point 100.

In communication over forward links 120 and 126, the transmitting antennas of access point 100 may utilize beamforming in order to improve the signal-to-noise ratio of forward links for the different access terminals 116 and 122. Also, an access point using beamforming to transmit to access terminals scattered randomly through its coverage causes less interference to access terminals in neighboring cells than an access point transmitting through a single antenna to all its access terminals.

Figure 2:
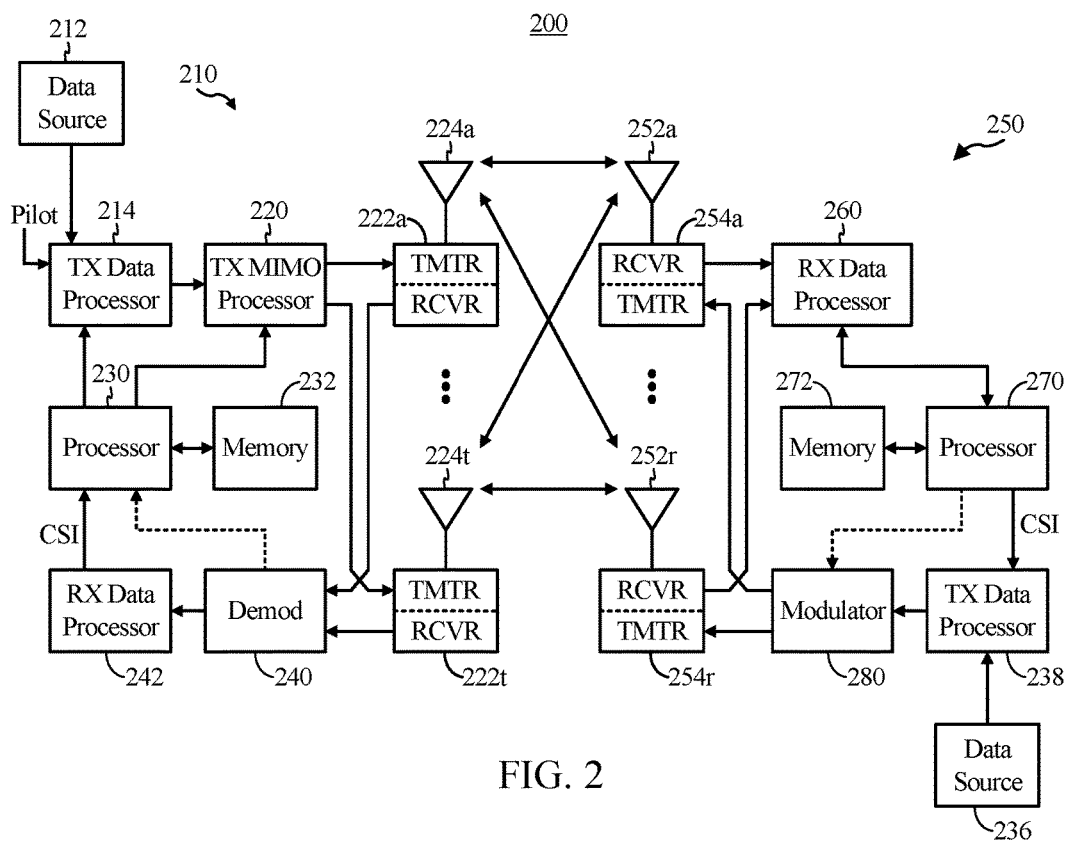
FIG. 2 illustrates a block diagram of an access point and a user terminal in accordance with certain aspects of the present disclosure.

FIG. 2 illustrates a block diagram of an aspect of a transmitter system 210 (e.g., also known as the access point/base station) and a receiver system 250 (e.g., also known as the access terminal) in a wireless communications system, for example, a MIMO system 200, in which aspects of the present disclosure may be practiced. At the transmitter system 210, traffic data for a number of data streams is provided from a data source 212 to a transmit (TX) data processor 214.

In one aspect of the present disclosure, each data stream may be transmitted over a respective transmit antenna. TX data processor 214 formats, codes, and interleaves the traffic data for each data stream based on a particular coding scheme selected for that data stream to provide coded data.

The coded data for each data stream may be multiplexed with pilot data using OFDM techniques. The pilot data is typically a known data pattern that is processed in a known manner and may be used at the receiver system to estimate the channel response. The multiplexed pilot and coded data for each data stream is then modulated (i.e., symbol mapped) based on a particular modulation scheme (e.g., BPSK, QPSK, m-QPSK, or m-QAM) selected for that data stream to provide modulation symbols. The data rate, coding, and modulation for each data stream may be determined by instructions performed by processor 230.

The modulation symbols for all data streams are then provided to a TX MIMO processor 220, which may further process the modulation symbols (e.g., for OFDM). TX MIMO processor 220 then provides $N_T$ modulation symbol streams to $N_T$ transmitters (TMTR) 222a through 222t. In certain aspects of the present disclosure, TX MIMO processor 220 applies beamforming weights to the symbols of the data streams and to the antenna from which the symbol is being transmitted.

Each transmitter 222 receives and processes a respective symbol stream to provide one or more analog signals, and further conditions (e.g., amplifies, filters, and upconverts) the analog signals to provide a modulated signal suitable for transmission over the MIMO channel. $N_T$ modulated signals from transmitters 222a through 222t are then transmitted from $N_T$ antennas 224a through 224t, respectively.

At receiver system 250, the transmitted modulated signals may be received by $N_R$ antennas 252a through 252r and the received signal from each antenna 252 may be provided to a respective receiver (RCVR) 254a through 254r. Each receiver 254 may condition (e.g., filters, amplifies, and downconverts) a respective received signal, digitize the conditioned signal to provide samples, and further process the samples to provide a corresponding "received" symbol stream.

An RX data processor 260 then receives and processes the $N_R$ received symbol streams from $N_R$ receivers 254 based on a particular receiver processing technique to provide $N_T$ "detected" symbol streams. The RX data processor 260 then demodulates, deinterleaves, and decodes each detected symbol stream to recover the traffic data for the data stream. The processing by RX data processor 260 may be complementary to that performed by TX MIMO processor 220 and TX data processor 214 at transmitter system 210.

A processor 270 periodically determines which pre-coding matrix to use. Processor 270 formulates a reverse link message comprising a matrix index portion and a rank value portion. The reverse link message may comprise various types of information regarding the communication link and/or the received data stream. The reverse link message is then processed by a TX data processor 238, which also receives traffic data for a number of data streams from a data source 236, modulated by a modulator 280, conditioned by transmitters 254a through 254r, and transmitted back to transmitter system 210.

At transmitter system 210, the modulated signals from receiver system 250 are received by antennas 224, conditioned by receivers 222, demodulated by a demodulator 240, and processed by a RX data processor 242 to extract the reserve link message transmitted by the receiver system 250. Processor 230 then determines which pre-coding matrix to use for determining the beamforming weights, and then processes the extracted message.

Figure 3:
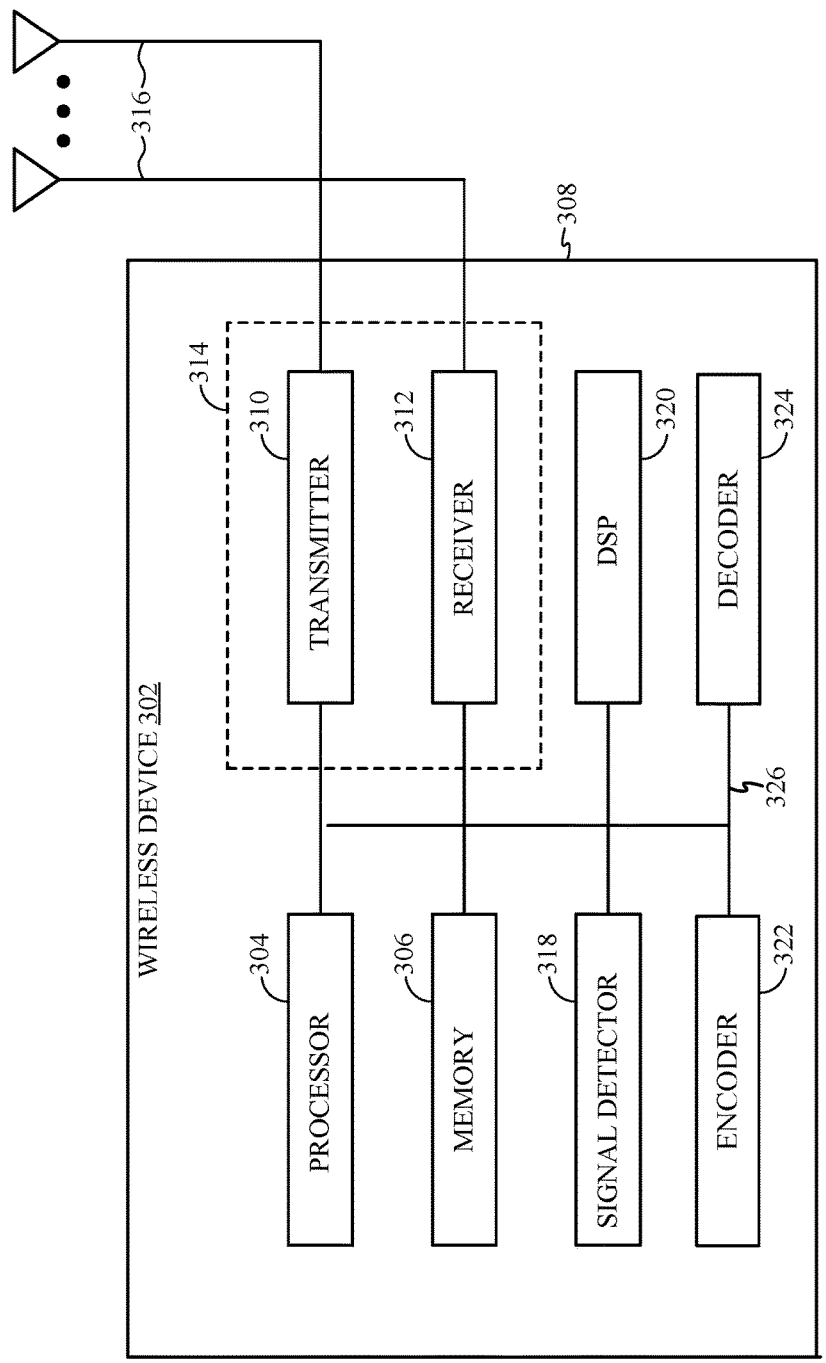
FIG. 3 illustrates a block diagram of an example wireless device in accordance with certain aspects of the present disclosure.

FIG. 3 illustrates various components that may be utilized in a wireless device 302 that may be employed within the wireless communication system from FIG. 1. The wireless device 302 is an example of a device that may be configured to implement the various methods described herein. The wireless device 302 may be an access point 100 from FIG. 1 or any of access terminals 116, 122.

The wireless device 302 may include a processor 304 which controls operation of the wireless device 302. The processor 304 may also be referred to as a central processing unit (CPU). Memory 306, which may include both read-only memory (ROM) and random access memory (RAM), provides instructions and data to the processor 304. A portion of the memory 306 may also include non-volatile random access memory (NVRAM). The processor 304 typically performs logical and arithmetic operations based on program instructions stored within the memory 306. The instructions in the memory 306 may be executable to implement the methods described herein.

The wireless device 302 may also include a housing 308 that may include a transmitter 310 and a receiver 312 to allow transmission and reception of data between the wireless device 302 and a remote location. The transmitter 310 and receiver 312 may be combined into a transceiver 314. A single or a plurality of transmit antennas 316 may be attached to the housing 308 and electrically coupled to the transceiver 314. The wireless device 302 may also include (not shown) multiple transmitters, multiple receivers, and multiple transceivers.

The wireless device 302 may also include a signal detector 318 that may be used in an effort to detect and quantify the level of signals received by the transceiver 314. The signal detector 318 may detect such signals as total energy, energy per subcarrier per symbol, power spectral density and other signals. The wireless device 302 may also include a digital signal processor (DSP) 320 for use in processing signals.

Additionally, the wireless device may also include an encoder 322 for use in encoding signals for transmission and a decoder 324 for use in decoding received signals. According to certain aspects, the decoder 324 may perform decoding according to certain aspects presented herein (e.g., by implementing operations 1100 illustrated in FIG. 11). Additional details of the decoder 324 will be described in greater detail below with reference to FIG. 14.

The various components of the wireless device 302 may be coupled together by a bus system 326, which may include a power bus, a control signal bus, and a status signal bus in addition to a data bus. The processor 304 may be configured to access instructions stored in the memory 306 to perform connectionless access, in accordance with aspects of the present disclosure discussed below.

Figure 4:
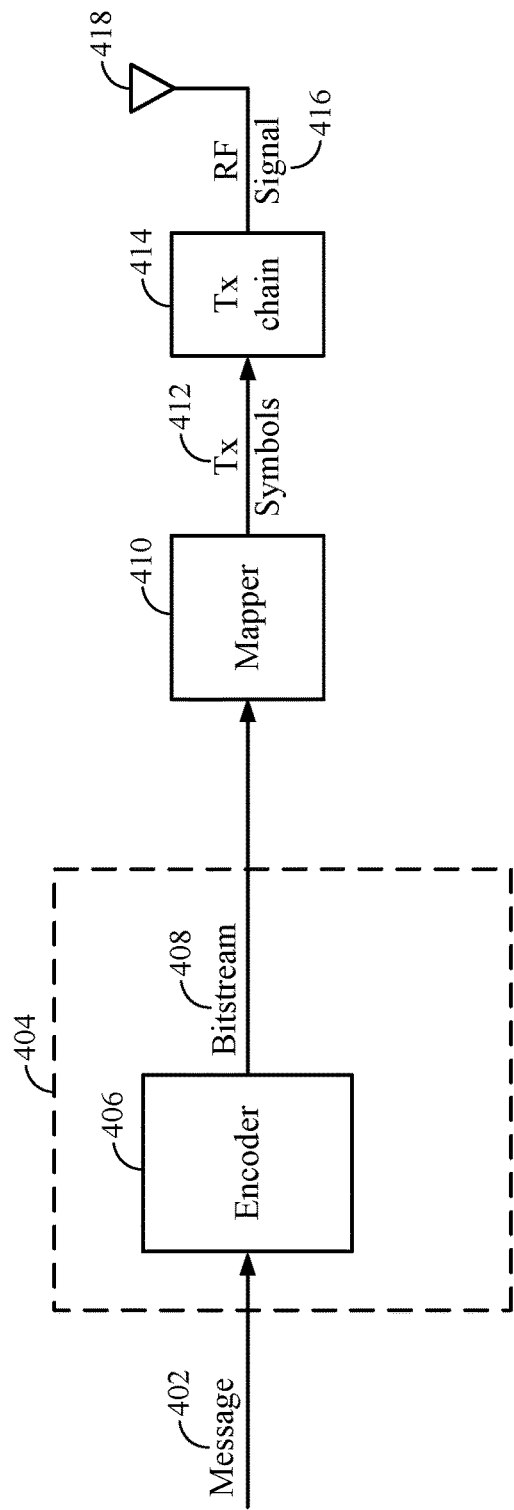
FIG. 4 is a block diagram illustrating a decoder, in accordance with certain aspects of the present disclosure.

FIG. 4 illustrates a portion of a radio frequency (RF) modem 404 that may be configured to provide an encoded message for wireless transmission. In one example, an encoder 406 in a base station (e.g., BS 100 and/or 210) (or an access terminal on the reverse path) receives a message 402 for transmission. The message 402 may contain data and/or encoded voice or other content directed to the receiving device. The encoder 406 encodes the message using a suitable modulation and coding scheme (MCS), typically selected based on a configuration defined by the base station 100/210 or another network entity. In some cases, the encoder 406 may encode the message using techniques described below (e.g., by using a Polar code). An encoded bitstream 408 produced by the encoder 406 may then be provided to a mapper 410 that generates a sequence of Tx symbols 412 that are modulated, amplified and otherwise processed by Tx chain 414 to produce an RF signal 416 for transmission through antenna 418.

Figure 5:
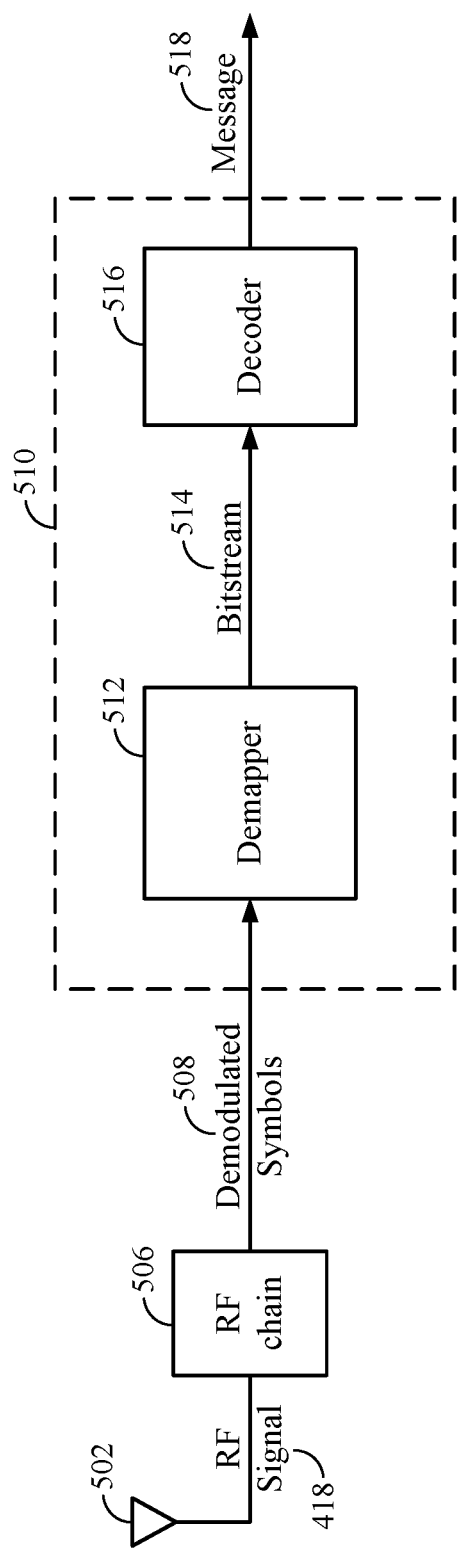
FIG. 5 is a block diagram illustrating a decoder, in accordance with certain aspects of the present disclosure.

FIG. 5 illustrates a portion of a RF modem 510 that may be configured to receive and decode a wirelessly transmitted signal including an encoded message (e.g., a message encoded using a tail biting convolutional code as described below). In various examples, the modem 510 receiving the signal may reside at the access terminal, at the base station, or at any other suitable apparatus or means for carrying out the described functions. An antenna 502 provides an RF signal 418 (i.e., the RF signal produced in FIG. 4) to an access terminal (e.g., access terminal 116, 122, and/or 250). An RF chain 506 processes and demodulates the RF signal 418 and may provide a sequence of symbols 508 to a demapper 512, which produces a bitstream 514 representative of the encoded message.

A decoder 516 (which may correspond to the decoder 324 of the wireless device 302) may then be used to decode m-bit information strings from a bitstream that has been encoded using a coding scheme (e.g., a TBCC encoding scheme). The decoder 516 may comprise a Viterbi decoder, an algebraic decoder, a butterfly decoder, or another suitable decoder. In one example, a Viterbi decoder employs the well-known Viterbi algorithm to find the most likely sequence of signaling states (the Viterbi path) that corresponds to a received bitstream 514. The bitstream 514 may be decoded based on a statistical analysis of LLRs calculated for the bitstream 514. In one example, a Viterbi decoder may compare and select the correct Viterbi path that defines a sequence of signaling states using a likelihood ratio test to generate LLRs from the bitstream 514. Likelihood ratios can be used to statistically compare the fit of a plurality of candidate Viterbi paths using a likelihood ratio test that compares the logarithm of a likelihood ratio for each candidate Viterbi path (i.e. the LLR) to determine which path is more likely to account for the sequence of symbols that produced the bitstream 514. The decoder 516 may then decode the bitstream 514 based on the LLRs to determine the message 518 containing data and/or encoded voice or other content transmitted from the base station (e.g., BS 100 and/or 210). The decoder may decode the bitsteam 514 in accordance with aspects of the present disclosure presented below (e.g., by implementing operations 1100 illustrated in FIG. 11). Additional details of the decoder 516 will be described in greater detail below with reference to FIG. 14.

Figures 6, 7:
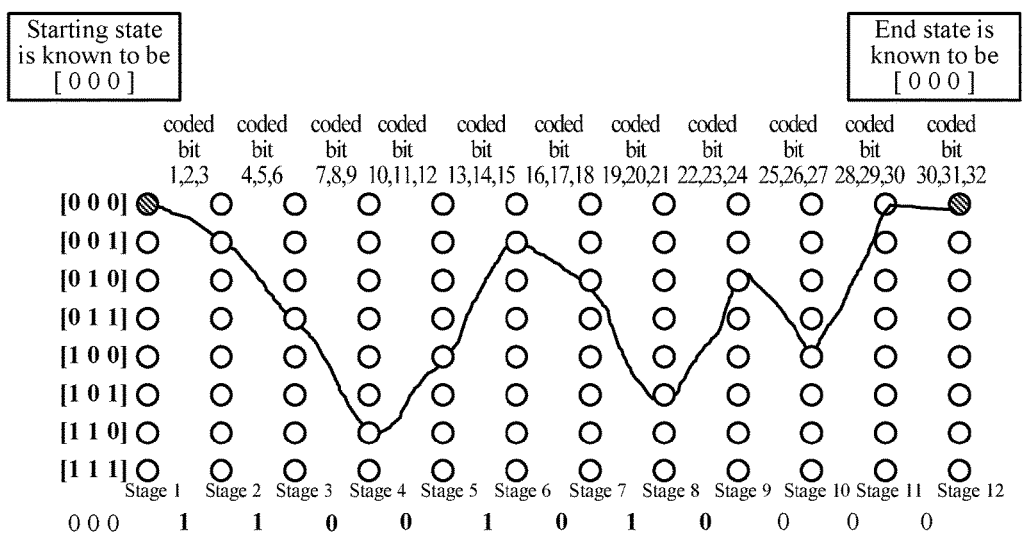
FIG. 6 illustrates an example of convolutional coding according to some aspects.
FIG. 7 illustrates an example of a Viterbi algorithm for decoding a convolutionally coded bit stream.

According to certain aspects, a convolutional coding algorithm may be used to encode a stream of bits, to generate an encoded codeword. FIG. 6 illustrates an example of convolutional coding, in which a stream of information bits is encoded. As illustrated, the encoding may start with a known sequence of bits (e.g., 000 in this example) and each encoded bit may be generated as a function of the previous bits. The same known sequence of bits is appended at the end.

As illustrated in FIG. 7, the encoded codeword may be decoded using a Trellis structure. In a trellis structure, each stage in the Trellis has one of several states (e.g., 8 states if each bit is encoded based on previous three bits). Each transition from one stage to the other is a function of the previous bits and a "new" bit being encoded. In the illustrated example, since the first bit is a "1" the transition is from the state "000" in the first stage to the state "001" in the second stage (then from the "001" state in the second stage to "011" in the third stage, etc.). Thus there are only a finite number of valid decoding paths through the Trellis as the validity of a decoding path is a function of the bits used for encoding (i.e., the previous bits and the "new" bit being encoded). While FIG. 7 illustrates a trellis structure with 8 states, it should be understood that trellis structures may contain any number of states depending on how many "previous bits" are used to encode a "new bit".

As described above, and as illustrated in FIG. 7, the starting state and ending state are both known, a fact that may be exploited when decoding (e.g., any decoding paths through the Trellis that do not begin and end with the know state can be disqualified). For example, with reference to FIG. 7, assuming that the starting state is known to be [000] (e.g., as illustrated), any decoding paths that do not end with an ending state of [000] may be automatically disqualified. For example, a decoding path with a starting state of [000] and an ending state of [111] may be disqualified.

Figure 8:
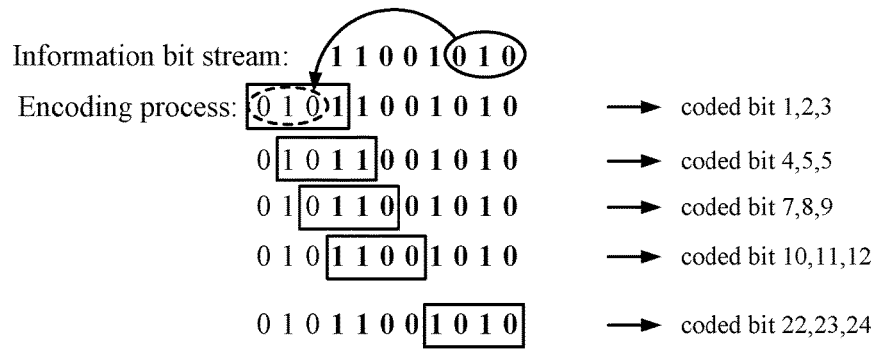
FIG. 8 illustrates an example of encoding via a tail biting convolutional code (TBCC).
Figure 9:
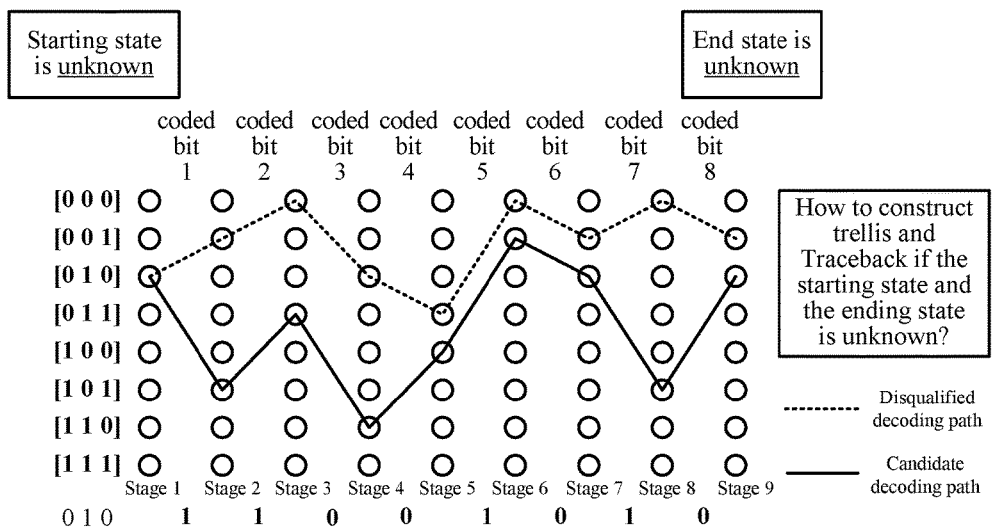
FIG. 9 illustrates an example of a Viterbi algorithm for decoding a TBCC encoded bit stream.

FIG. 8 illustrates an example of encoding via a tail biting convolutional code (TBCC). The TBCC algorithm is named such because the "tail" end of the bits are appended to the start of the encoded bit stream, for example, as illustrated. Thus, in this case, the starting and ending states are the same (as in FIG. 7), but the state is not fixed (rather it depends on the value of the tail bits). In the illustrated example, the value of the tail bits (and thus starting and end states) is "010." Thus, as illustrated by the solid line in FIG. 9, since the first bit is a "1" the transition is from the starting state "010" in the first stage to the state "101" in the second stage (then from the "101" state in the second stage to "011" in the third stage, etc.). Using a TBCC decoding Trellis, as illustrated in FIG. 9, any decoding paths that do not begin and end at the same state (although initially unknown) may be disqualified. For example, assume again the starting state is "010". In this example, however, illustrated by the dashed line in FIG. 9, the starting state (i.e., "010") does not match the ending state (e.g., "001"). Thus, this decoding path may be disqualified.

Figure 10:
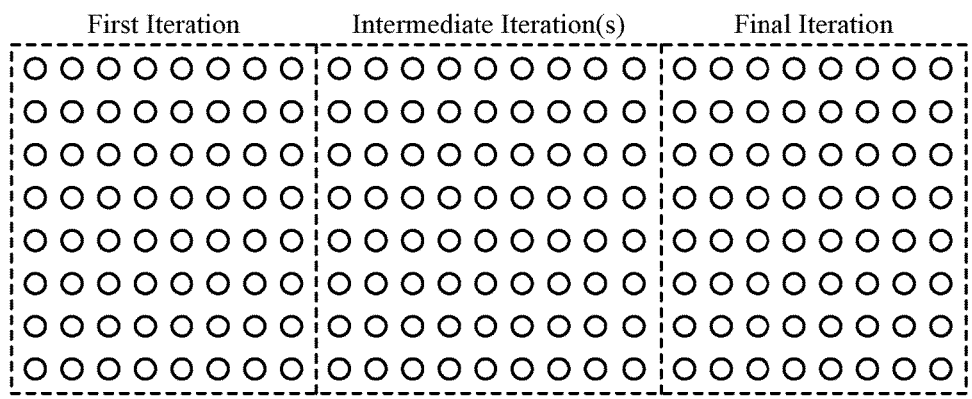
FIG. 10 illustrates an example iterative process of a Viterbi algorithm for decoding a TBCC encoded bit stream.

As illustrated in FIG. 10, one algorithm for decoding a TBCC encoded codeword is through a series of iterations. For example, in a first iteration, a decoder (e.g., decoder 324 and/or 516) may begin constructing a decoding trellis having each state starting with an equal weight. At the end of the trellis construction (e.g., after a final iteration), the decoder 324 and/or 516 may identify a number of best states, then perform a back trace output over a certain range of stages for the decoded bits and select a decoding path based on metrics (e.g., such as the path metrics, tail byte check, etc.) generated during these iterations to derive decoded bits.

According to aspects, a TBCC list decoder generally refers to a TBCC decoder in which a "list" of candidate decoding paths is maintained and evaluated. A best candidate (e.g., the candidate path(s) with the most accurate decoding metric(s)) from the list is ultimately chosen as the decoded codeword, provided certain criteria are met (e.g., that a CRC check for the decoded codeword passes). According to certain aspects, choosing a best candidate may be performed in at least two phases of decoding. For example, in first phase, a best candidate may be chosen during trellis construction at each stage, where the "best" L (namely, list size) number of candidates, in terms of accumulated path metrics, are selected for each state of a trellis stage. Additionally, in a second phase, a best candidate may be chosen (or further refined) after trellis construction and before back-tracing, where a set (could be "L" or else, depending on design choice) of "best" path candidates, in terms of accumulated path metrics, are selected for back-tracing.

In some cases, to improve decoding efficiency of the TBCC decoder it may be beneficial to propagate state information through trellis stages of the decoder. For example, propagating original (beginning) state information (e.g., at a beginning stage) to later stage in the decoder would allow candidate decoding paths (that do not end at the same state) to be disqualified (e.g., sooner as compared to decoders that do not propagate state information), thus reducing the number of candidate paths that would need to be evaluated and reducing the amount of time needed to decode a codeword.

Figure 11:
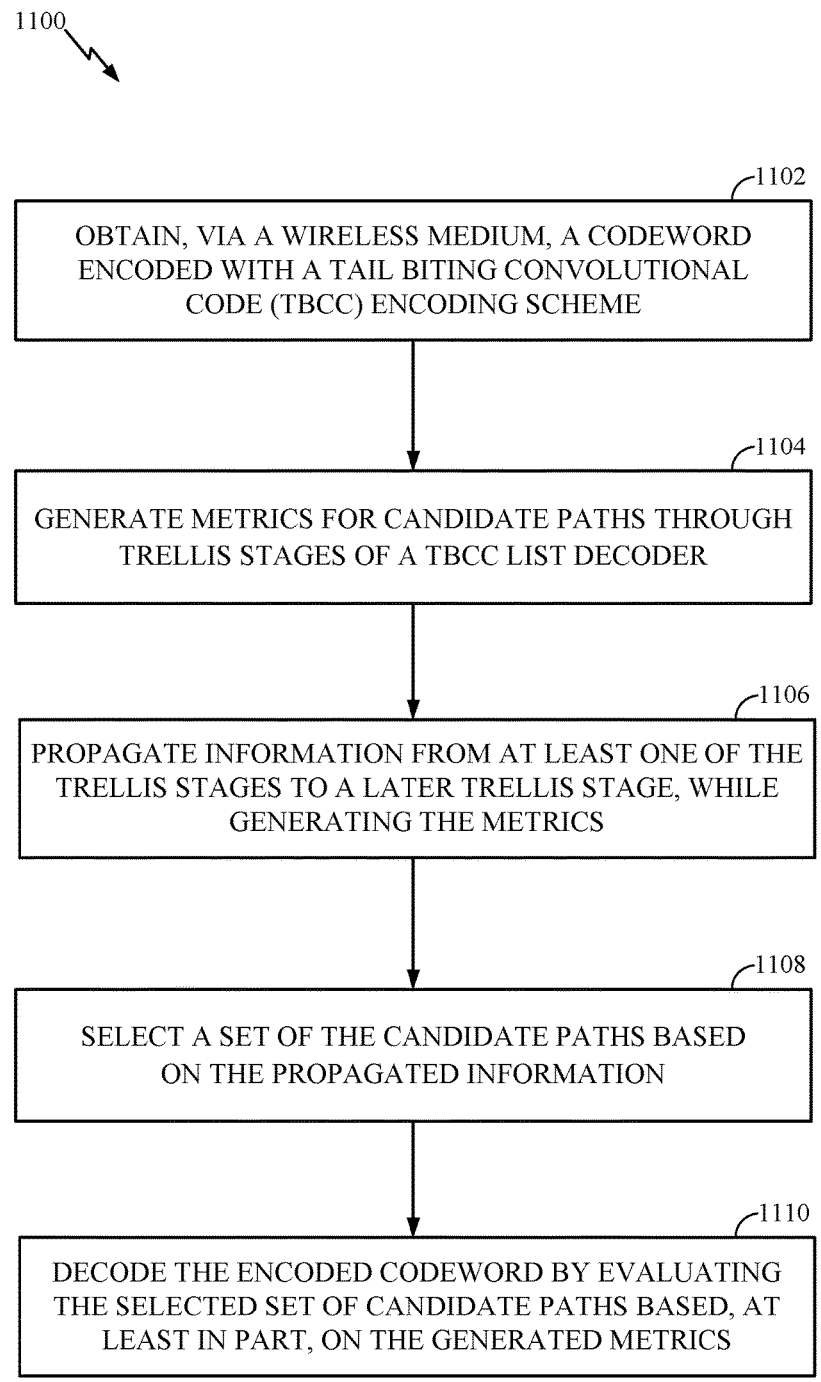
FIG. 11 illustrates example operations for wireless communications, in accordance with certain aspects of the present disclosure.

FIG. 11 illustrates example operations 1100 for wireless communications using enhanced TBCC list decoding, in accordance with certain aspects of the present disclosure. The operations 1100 may be performed by any suitable receiving device (e.g., a UE or base station) to decode a TBCC encoded codeword, for example, using a decoder such as the decoder 324 and/or 516.

The operations 1100 begin, at 1102, by obtaining, via a wireless medium, a codeword encoded with a tail biting convolutional code (TBCC) encoding scheme. At 1104, the decoder generates metrics for candidate paths through trellis stages of a TBCC list decoder. While generating the metrics, at 1106, the decoder propagates information from at least one of the trellis stages to a later trellis stage. According to certain aspects, propagating the information may be performed at the same time as generating the metrics or may be performed in an iterative fashion while generating the metrics. For example, in some cases, the decoder may generate a metric for a first candidate path at time T, and at time T+1, the decoder propagates information from one trellis stage to a later trellis stage, and so on.

At 1108, the decoder selects a set of the candidate paths based on the propagated information. At 1110, the decoder decodes the encoded codeword by evaluating the selected set of candidate paths based, at least in part, on the generated metrics.

The propagated information may, for example, be state information or some other type of path metrics (e.g., state info of a path, path metric of a path, rank of a path among all candidate paths, distribution (in terms of percentage or relative path metric ratio, etc.) of path metrics among candidate paths, etc.). As noted, propagating the original (beginning) state information, would allow candidate decoding paths (that do not end at the same state) to be disqualified. For example, propagating the state information from a starting state to an ending state allows the decoder to readily know the starting state of any candidate path in the trellis. According to aspects, without such propagation of state information, the starting state of any candidate path cannot be known until completion of back tracing, which is not only time consuming, but also increases the required number of back-traces of candidate paths to achieve a same number of tail-biting candidate paths.

Figure 12:
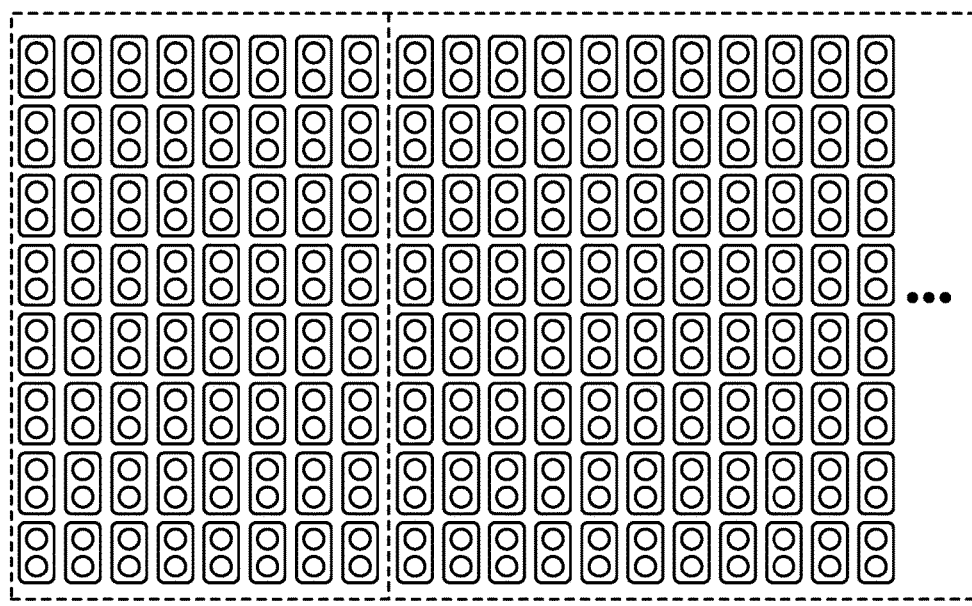
FIGS. 12 and 13 illustrate examples of different phases of a multi-phase decoding algorithm, in accordance with certain aspects of the present disclosure.

As a result, the decoding algorithm proposed herein (i.e., propagating state information through the trellis) may help a decoder (or any processing device used to implement the decoding algorithm) perform more efficiently (e.g., by reducing the amount of time and complexity of decoding codewords), which may be considered an improvement to functionality of any type of decoder, however such a decoder is implemented. The algorithms presented herein, may reduce real-time decoding complexity and allow wireless communications systems to achieve higher bit rates. In some cases, the algorithm described herein may be considered a list decoder (with list size L) performed in multiple phases. For example, as illustrated in FIG. 12, in an initial phase, referred to herein as a state warm-up (SW) phase, a set of decoding candidates may be selected (e.g., to limit the number of decoding candidates to be evaluated in a later phase) and metrics generated for these selected decoding candidates. As an example, in the SW phase, an "$L_{SW}$, ($0<L_{SW}<=L$)" sized list decoder that is initialized with equal state metrics and spanning a suitable number of Trellis stages may be used to evaluate path candidate states by deriving metrics for each state. For example, in some cases the list decoder may have a size L=4 and, in the initial phase of the decoder, the selected number of limited decoding candidates may equal $L_{SW}=1$. As noted, limiting the number of decoding candidate paths to be evaluated in a later phase may reduce real-time decoding complexity and allow wireless communications systems to achieve higher bit rates.

Figure 13:
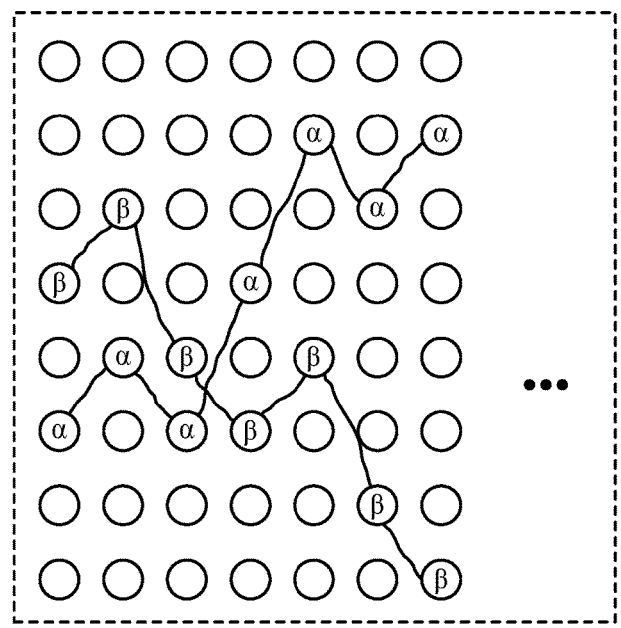

As illustrated in FIGS. 12 and 13, in a subsequent phase (e.g., subsequent to the SW phase), referred to herein Path development (PD) phase, using states and corresponding metrics derived in the SW phase, path information may be developed (including state index, path metrics, rank of paths, path metrics represented in terms of percentage or relative ratio, etc.) of list size "L" in the Viterbi trellis, which may span at least one full codeword length worth of stages. As noted above, information may be propagated over the stages, for example, with a suitably identified originating stage and with the originating state information noted and propagated over stages for those candidate paths being developed (and evaluated).

In a third phase, referred to herein as a select & decode (SD) phase, the decoder may select and decode a suitable set of candidates (candidate decoding paths) by evaluating the metric and (tail-biting) state information derived in the PD phase and by back tracing over a suitably identified range of stages in the trellis. As described above, the candidate paths may only include those paths that satisfy the TBCC criteria that the originating state and end state are the same. In addition, candidate paths may be disqualified based on an error check, such as a cyclic redundancy check (CRC).

Figure 14:
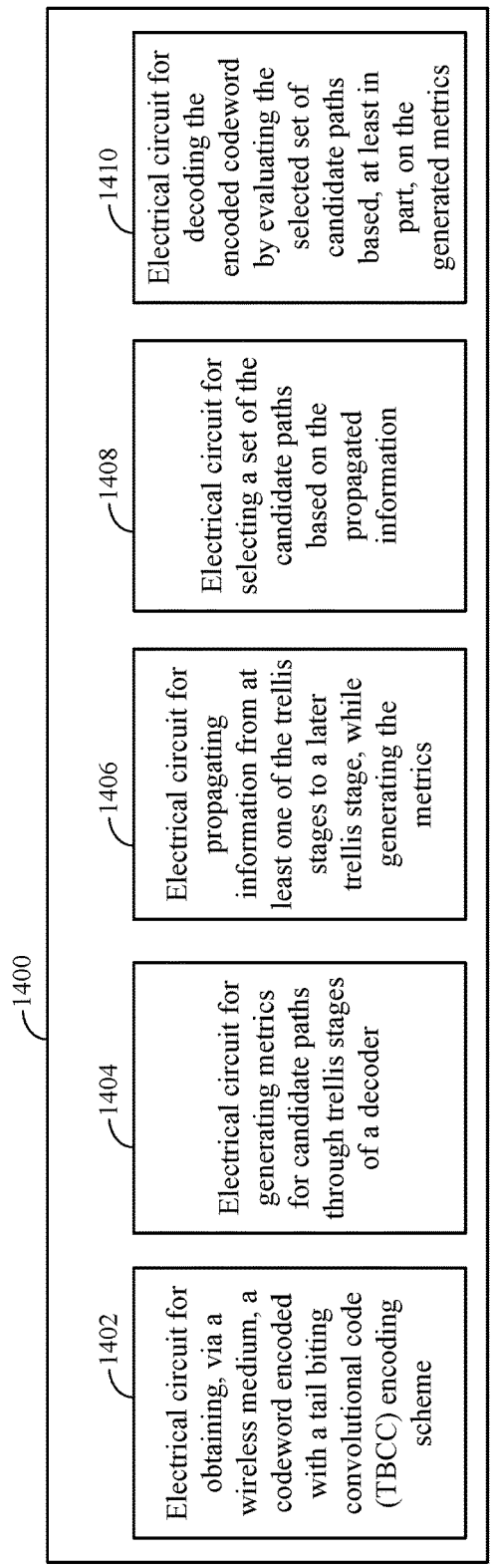
FIG. 14 illustrates a decoder configured to perform enhanced TBCC list decoding, in accordance with aspects of the present disclosure.

FIG. 14 illustrates a decoder 1400 configured to perform enhanced TBCC list decoding, in accordance with aspects of the present disclosure. According to aspects, the decoder 1400 may comprise the decoder 324 and/or the decoder 516. As illustrated, the decoder 1400 comprises a number of electrical circuits configured to perform, for example, the operations 1100 illustrated in FIG. 11. For example, the decoder 1400 includes an electrical circuit 1402 for obtaining, via a wireless medium, a codeword encoded with a tail biting convolutional code (TBCC) encoding scheme. Additionally, the decoder 1400 includes and electrical circuit 1404 for generating metrics for candidate paths through trellis stages of a decoder. Additionally, the decoder 1400 includes and electrical circuit 1406 for propagating information from at least one of the trellis stages to a later trellis stage, while generating the metrics. Additionally, the decoder 1400 includes and electrical circuit 1408 for selecting a set of the candidate paths based on the propagated information. Additionally, the decoder 1400 includes and electrical circuit 1410 for decoding the encoded codeword by evaluating the selected set of candidate paths based, at least in part, on the generated metrics.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

For example, means for obtaining may comprise the transmitter/receiver 222 or the antenna 224 of the base station 100 and/or the transmitter/receiver 254 or the antenna 252 of the access terminal 250. Additionally, means for generating, means for propagating, means for selecting, means for decoding, means for deriving, and means for disqualifying may comprise one or more processors, such as the processor 230 of the base station 100 or the processor 270 of the access terminal 250.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and/or write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and BLU-RAY® media disc where disks usually reproduce data magnetically, while discs reproduce data optically with lasers. Combinations of the above should also be included within the scope of computer-readable media.

As used herein, a phrase referring to "at least one of" a list of items refers to any combination of those items, including single members. As an example, "at least one of: a, b, or c" is intended to cover: a, b, c, a-b, a-c, b-c, and a-b-c.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A method for wireless communications, comprising:
    obtaining a codeword via a wireless medium;
    generating metrics for candidate decoding paths through trellis stages of a decoder;
    propagating information from at least one of the trellis stages to a later trellis stage, wherein the information comprises originating-state information, and wherein the propagated information further comprises the generated metrics;
    selecting a set of the candidate decoding paths based on the propagated information, wherein the selecting comprises disqualifying a candidate decoding path from inclusion in the set if corresponding originating state information does not match ending state information; and
    decoding the encoded codeword by evaluating the selected set of candidate decoding paths based, at least in part, on the generated metrics for the candidate decoding paths.

2. The method of claim 1, further comprising providing the decoder as a list decoder initialized with equal state metrics, and selecting the set of candidate decoding paths via evaluating the candidate decoding paths by deriving metrics for each state over a number of trellis stages of the list decoder.

3. The method of claim 2, further comprising using the metrics derived for each state to generate the metrics for the candidate decoding paths through trellis stages of the decoder.

4. The method of claim 1, wherein the selecting is based further on error check information for each candidate decoding path in the set of candidate decoding paths, and wherein the selecting comprises:
    disqualifying a first candidate decoding path from inclusion in the set if the error check information generated for the first candidate decoding path does not match error check information included in the codeword.

5. The method of claim 1, wherein, for a warm-up decoding phase, generating the metrics comprises:
    selecting a limited set of the candidate decoding paths; and
    generating the metrics for the limited set of candidate decoding paths.

6. An apparatus for wireless communications, comprising:
    at least one processor configured to:
        obtain a codeword via a wireless medium;
        generate metrics for candidate decoding paths through trellis stages of a decoder;
        propagate information from at least one of the trellis stages to a later trellis stage, wherein the information comprises originating-state information, and wherein the propagated information further comprises the generated metrics;
        select a set of the candidate decoding paths based on the propagated information, wherein the at least one processor is configured to select the set of the candidate decoding paths by disqualifying a candidate decoding path from inclusion in the set if corresponding originating state information does not match ending state information; and
        decode the encoded codeword by evaluating the selected set of candidate decoding paths based, at least in part, on the generated metrics for the candidate decoding paths; and
    a memory coupled with the at least one processor.

7. The apparatus of claim 6, wherein the at least one processor is configured to provide the decoder as a list decoder initialized with equal state metrics, and wherein the at least one processor is configured to select the set of the candidate decoding paths by:

evaluating the candidate decoding paths by deriving metrics for each state over a number of trellis stages of the list decoder.

8. The apparatus of claim 7, wherein the at least one processor is configured to use the metrics derived for each state to generate the metrics for the candidate decoding paths through trellis stages of the decoder.

9. The apparatus of claim 6, wherein the at least one processor is configured to select the set of the candidate decoding paths based further on error check information for each candidate decoding path in the set of candidate decoding paths, and wherein the at least one processor is configured to select the set of the candidate decoding paths by:

disqualifying a first candidate decoding path from inclusion in the set if the error check information generated for the first candidate decoding path does not match error check information included in the codeword.

10. The apparatus of claim 6, wherein, for a warm-up decoding phase, the at least one processor is configured to generate the metrics by:

selecting a limited set of the candidate decoding paths; and generating the metrics for the limited set of candidate decoding paths.

11. An apparatus for wireless communications, comprising:

means for obtaining a codeword via a wireless medium;

means for generating metrics for candidate decoding paths through trellis stages of a decoder;

means for propagating information from at least one of the trellis stages to a later trellis stage, wherein the information comprises originating-state information, and wherein the propagated information further comprises the generated metrics;

means for selecting a set of the candidate decoding paths based on the propagated information, wherein the means for selecting are configured to select the set of the candidate decoding paths by disqualifying a candidate decoding path from inclusion in the set if corresponding originating state information does not match ending state information; and means for decoding the encoded codeword by evaluating the selected set of candidate decoding paths based, at least in part, on the generated metrics for the candidate decoding paths.

12. The apparatus of claim 11, wherein the decoder is provided as a list decoder initialized with equal state metrics, and wherein the means for selecting are configured to select the set of candidate decoding paths by:

evaluating the candidate decoding paths by deriving metrics for each state over a number of trellis stages of a list decoder.

13. The apparatus of claim 12, wherein the means for generating are configured to use the metrics derived for each state to generate the metrics for the candidate decoding paths through trellis stages of the decoder.

14. The apparatus of claim 11, wherein the means for selecting are configured to select the set of the candidate decoding paths based further on error check information for each candidate decoding path in the set of candidate decoding paths, and wherein the means for selecting are configured to select the set of the candidate decoding paths by:

disqualifying a first candidate decoding path from inclusion in the set if the error check information generated for the first candidate decoding path does not match error check information included in the codeword.

15. The apparatus of claim 11, wherein, for a warm-up decoding phase, the means for generating metrics are configured to generate the metrics by:

selecting a limited set of the candidate decoding paths; and generating the metrics for the limited set of candidate decoding paths.

16. A non-transitory computer-readable medium for wireless communications, comprising instructions for:

obtaining a codeword via a wireless medium;

generating metrics for candidate decoding paths through trellis stages of a decoder;

propagating information from at least one of the trellis stages to a later trellis stage, wherein the information comprises originating-state information, and wherein the propagated information further comprises the generated metrics;

selecting a set of the candidate decoding paths based on the propagated information, wherein the instructions for selecting the set of the candidate decoding paths further comprise instructions for disqualifying a candidate decoding path from inclusion in the set if corresponding originating state information does not match ending state information; and decoding the encoded codeword by evaluating the selected set of candidate decoding paths based, at least in part, on the generated metrics for the candidate decoding paths.

17. The non-transitory computer-readable medium of claim 16, wherein the decoder is provided as a list decoder initialized with equal state metrics, and wherein the instructions for selecting the set of candidate decoding paths further comprise instructions for:

evaluating the candidate decoding paths by deriving metrics for each state over a number of trellis stages of the list decoder.

18. The non-transitory computer-readable medium of claim 17, wherein the metrics derived for each state are used when generating the metrics for the candidate decoding paths through trellis stages of the decoder.

19. The non-transitory computer-readable medium of claim 16, wherein the instructions for selecting are configured to select the set of the candidate decoding paths based further on error check information for each candidate decoding path in the set of candidate decoding paths, and wherein the instructions for selecting comprise instructions for:

disqualifying a first candidate decoding path from inclusion in the set if the error check information generated for the first candidate decoding path does not match error check information included in the codeword.

20. The non-transitory computer-readable medium of claim 16, wherein, for a warm-up decoding phase, the instructions for generating metrics further comprise instructions for:

selecting a limited set of the candidate decoding paths; and generating the metrics for the limited set of candidate decoding paths.

* * * * *